United States Patent [19]

Chen et al.

[11] Patent Number: 4,941,028

[45] Date of Patent: Jul. 10, 1990

[54] STRUCTURE FOR PROTECTING THIN DIELECTRICS DURING PROCESSING

[75] Inventors: Shih-Ou Chen, Fremont; John L. McCollum; Steve S. Chiang, both of Saratoga, all of Calif.

[73] Assignee: Actel Corporation, Sunnyvale, Calif.

[21] Appl. No.: 230,463

[22] Filed: Aug. 10, 1988

[51] Int. Cl.$^5$ .............................................. H01L 21/76
[52] U.S. Cl. ................................... 357/23.13; 357/59; 437/967; 361/91
[58] Field of Search ................. 361/91; 357/23.13, 59, 357/49; 437/967

[56] References Cited

U.S. PATENT DOCUMENTS 4,543,597 9/1985 Shibata ............................. 357/23.6
4,786,956 11/1988 Puar .................................. 357/23.13

Primary Examiner—Andrew J. James
Assistant Examiner—David L. Soltz
Attorney, Agent, or Firm—Lyon & Lyon

[57] ABSTRACT

A structure used to protect a dielectric is disclosed wherein a transistor located nearby the dielectric is connected in series with a conductor overlying the fragile dielectric such that the transistor gate will accumulate charge along with the conductive material over the fragile dielectric. After fabrication and during normal circuit operation, this transistor device remains in an off state, isolating the fragile dielectric node from other circuitry. In an alternate embodiment the protection transistor is a floating gate depletion device, which would always be on until the circuit is activated. At the time the circuit is activated, the device is turned off by trapping electrons on the gate by avalancing a junction associated with it. In a preferred, embodiment, a buried contact is formed after the conductor overlying the dielectric, usually polysilicon, is formed. This buried contact connects the conductor to the discharging transistor. Alternatively, a weak portion in the dielectric may be deliberately created by placing a lightly doped N-type diffusion in the area under which the buried contact is desired.

5 Claims, 3 Drawing Sheets

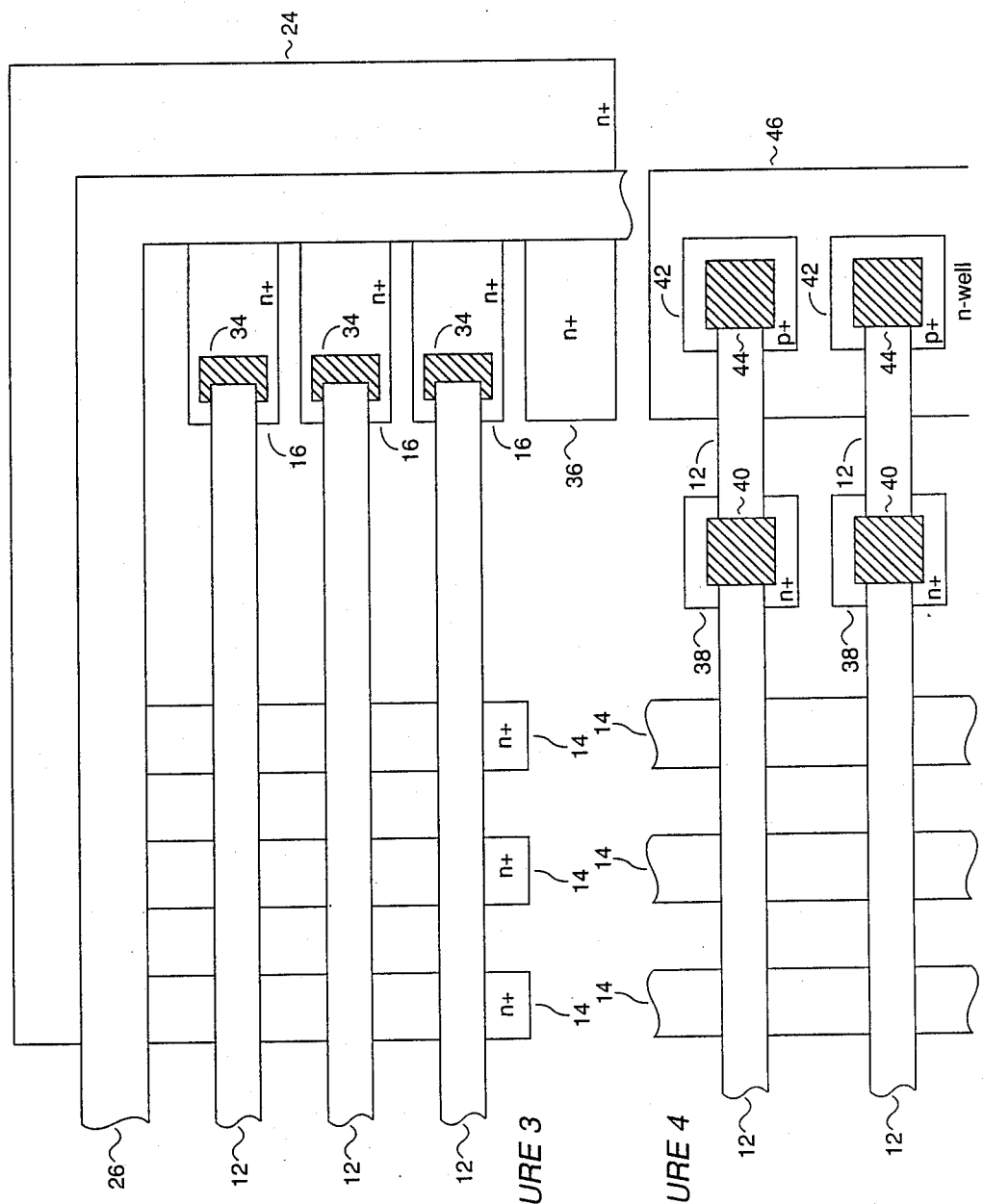

4,941,028

STRUCTURE FOR PROTECTING THIN DIELECTRICS DURING PROCESSING

BACKGROUND OF THE INVENTION

1. Field Of The Invention

The present invention relates to integrated circuit processing technology. More particularly, the present invention relates to integrated circuit processing technology involving thin film dielectrics and ways to protect these thin film dielectrics from damage during the manufacturing process.

2. The Prior Art

Low voltage dielectrics in integrated circuits are easily damaged in the course of the process of manufacturing the integrated circuits by voltages generated during electronic or ionic processing. Such processes include ion implantation, reactive ion etching, plasma deposition, plasma etching, and sputtering. If a charge buildup is allowed to develop a sufficient potential difference across the two conductors separated by the dielectric, to exceed the breakdown voltage of the dielectric, the dielectric may easily be damaged. Even if the voltage generated is less than the dielectric breakdown voltage, the dielectric may still be damaged by hot electrons generated by ultraviolet light or x-rays created during the semiconductor fabrication processing steps. These electrons then be swept through the dielectric at lower voltages.

Normally, dielectrics have been protected by connecting conductor overlying them to a diffusion in the substrate to discharge the voltage via the diffusion-substrate junction and thus remove any voltage which would otherwise exist across the dielectric. As dielectrics become ever thinner, this is no longer adequate to protect them. In addition, a diffusion will protect the dielectric in only one direction, i.e., the direction in which the diffusion-substrate diode is forward biased For example, an N-type diffusion in a P-type substrate connected to a conductive member overlying a dielectric will protect the dielectric only in the negative direction but not in the positive direction.

One application in which the protection of low voltage dielectrics is particularly critical is in the area of anti-fuse applications. An anti-fuse is a structure including a dielectric located between two conductors. The dielectrics may be selectively ruptured causing an ohmic connection to be formed between the two conductors In such an application, the anti-fuse structure will usually be associated with active devices such as programming transistors, and other transistors which form other functional parts of the circuitry. Plainly, the dielectrics breakdown voltage must be engineered to be lower than the junction breakdown voltage for the active devices if the anti-fuse is to be successfully programmed. See for example, U.S. Pat. No. 4,823,181, assigned to the same assignee as the present invention.

BRIEF DESCRIPTION OF THE INVENTION

A structure used to protect a fragile dielectric is disclosed wherein a transistor located nearby the dielectric is connected in series with a conductor overlying the fragile dielectric such that the transistor gate will accumulate charge along with the conductive material over the fragile dielectric. When the charge on the gate exceeds the transistor threshold voltage, it will turn on and remove any charge, thus protecting the dielectric. After fabrication and during normal circuit operation, this transistor device remains in an off state, isolating the fragile dielectric node from other circuitry.

In an alternate embodiment the protection transistor is a floating gate depletion device, which would always be on until the circuit is activated. At the time the circuit is activated, the device is turned off by trapping electrons on the gate by avalanching a junction associated with it.

The conductor overlying the fragile dielectric may be connected to the discharging transistor during the first metal deposition. There are, however, several steps in the fabrication process prior to metal deposition which could create conditions which could potentially damage the dielectric. Therefore, in a preferred embodiment, a buried contact is formed after the conductor overlying the dielectric, usually polysilicon, is formed. This buried contact connects the conductor to the discharging transistor. Alternatively, a weak portion in the dielectric may be deliberately created by placing a lightly doped N-type diffusion in the area under which the buried contact is desired. Since the dielectric material will grow more slowly over this diffusion, it will be thinner and tend to break down over this area, thus connecting the conductor over the dielectric to the discharging transistor. In many processes for manufacturing integrated circuits there is already an LDD (lightly doped drain) step, and therefore a small adjustment in the diffusion mask will be able to provide for such a diffusion area.

BRIEF DESCRIPTION OF THE DRAWINGS

FIG. 1 is a top view of a semiconductor integrated circuit layout showing protection transistors connected via metal lines to polysilicon strips overlying a fragile dielectric.

FIG. 1b is a semiconductor cross section drawing of the layout of FIG. 1a taken through line A—A of FIG. 1a.

FIG. 1c is a semiconductor cross section drawing taken through the line B—B of FIG. 1a.

FIG. 2b is a semiconductor cross section drawing of the layout of FIG. 2a taken through line A—A of FIG. 2a.

FIG. 3 is a top view of a semiconductor integrated circuit layout showing floating gate protection transistors connected via buried contacts to polysilicon strips overlying fragile dielectric regions.

FIG. 4 is a top view of a semiconductor integrated circuit layout showing polysilicon strips connected by buried contacts to N+ and P+ diffusions for protection of fragile dielectric regions.

DETAILED DESCRIPTION OF A PREFERRED EMBODIMENT

Figure 1C:
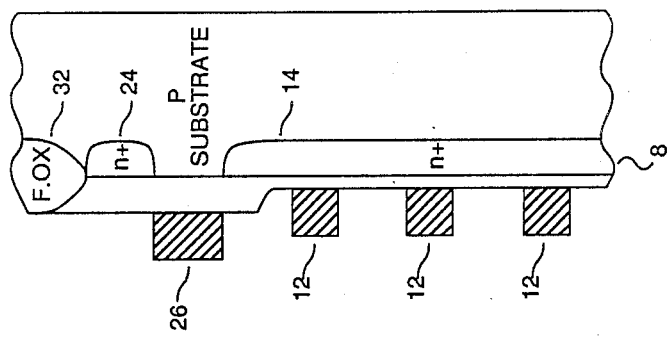
Figure 1B:
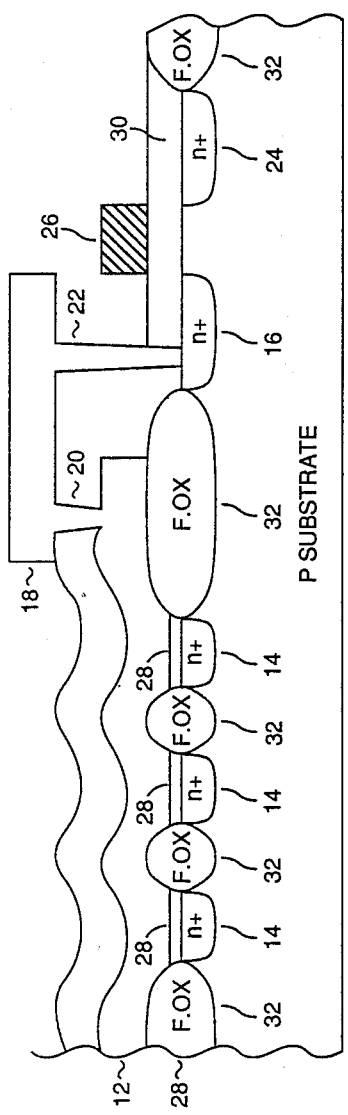
Figure 1A:
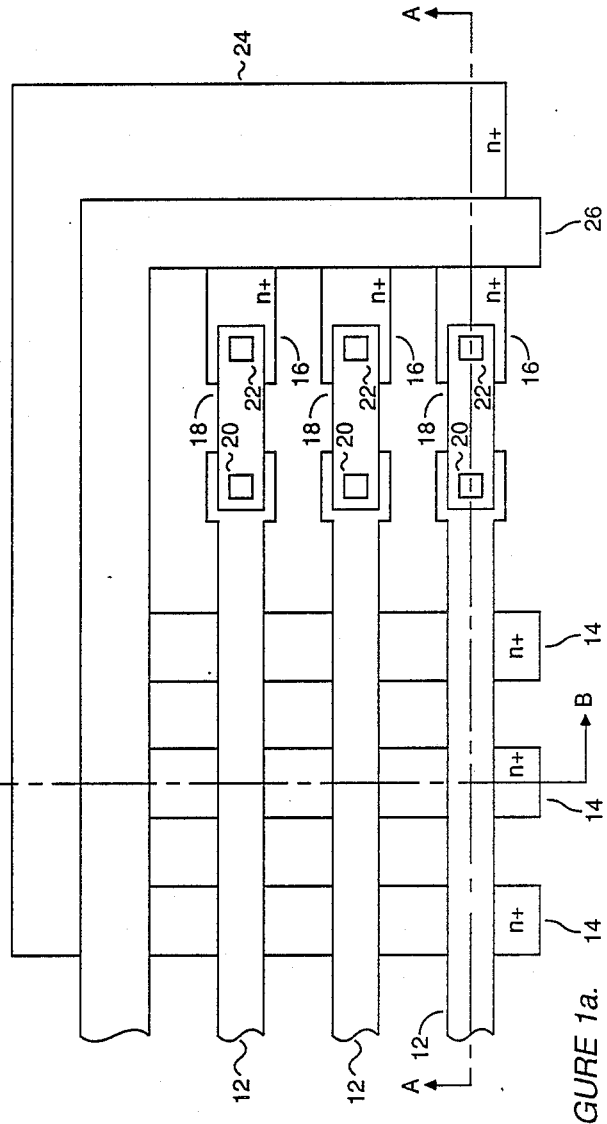

Referring first to FIG. 1a, polysilicon strips 12 lie over N+ diffusion regions 14. The fragile dielectric region to be protected lies under polysilicon strips 12 and can not be seen in FIG. 1a.

Polysilicon strips 12 are connected to N+ diffusion regions 16 via metal lines 18. Contacts 20 connect polysilicon lines 12 to metal lines 18 and contacts 22 connect metal lines 18 to N+ diffusion regions 16. N+ diffusion regions 16 form the drains for three protection transistors having a common source 24. A common gate member 26 preferably polysilicon, overlies the channel between drain N+ diffusion regions 16 and common source region 24. Gate member 26 has an upper horizontal portion which overlies the channel between N+ regions 14 and N-region 24. N+ regions 14 form the drains of three additional protection transistors while N-region 24 is the common source for those three transistors. Gate 26 is also the common gate for those three transistors.

Some of the details of the layout of FIG. 1a can more clearly be seen with respect to FIG. 1b. In FIG. 1b, dielectric region 28, to be protected, lies between N+ regions 14 and polysilicon line 12. One of the three transistors formed between N+ diffusion 16 and 24 having gate 26 overlying gate oxide region 30, can be seen at the right of FIG. 1b, as can the contacts 20 and 22, connecting metal line 18 with polysilicon line 12 and N+ diffusion 16. Other details, such as field oxide regions 32 and other structures common to integrated semiconductor structures, are shown but are not specifically a part of the present invention.

In the structure of FIGS. 1a-c, the thin dielectric region 28 is protected by the operation of the six transistors formed from N+ regions 14, 16, and 24 and gate 26. As charge builds up on polysilicon lines 12 with respect to diffusions 14, 16, and 24, a like charge will build up on gate 26. When the charge on gate 26 exceeds the threshold voltage of the transistors, (for example the transistor shown in FIG. 1b, having its drain as N+ diffusion region 16 and its source as N+ diffusion region 24), the transistors turn on and remove the charge on polysilicon line 12 via a contact 20 metal line 18 and contact 22. Likewise, referring to FIG. 1c, the transistor having its drain as N+ region 14 and its source region N+ region 24 turns on when the charge on gate 26 brings its gate-source voltage above its threshold. The net result is that diffusion regions 14, 24, and 16 are electrically connected together to polysilicon lines 12 by an ohmic connection, thus removing any potential difference which would otherwise exist across thin dielectric 28. After the fabrication of the entire integrated circuit on which the circuit shown in FIGS. 1a-c has been completed, gate 26 can be permanently connected to ground, thus assuring permanent isolation of N+ regions 14, 16, and 24 from one another.

The protection transistors shown in FIGS. 1a-c will function to protect thin dielectric region 28 only after the steps in the process which create metal line 18 and contacts 20 and 22. As those of ordinary skill in the art will readily appreciate, there are certain steps in the process which precede these metalization and contact formation steps which have a potential for damaging or destroying thin dielectric layer 28 after it has been fabricated and defined.

Figure 2B:
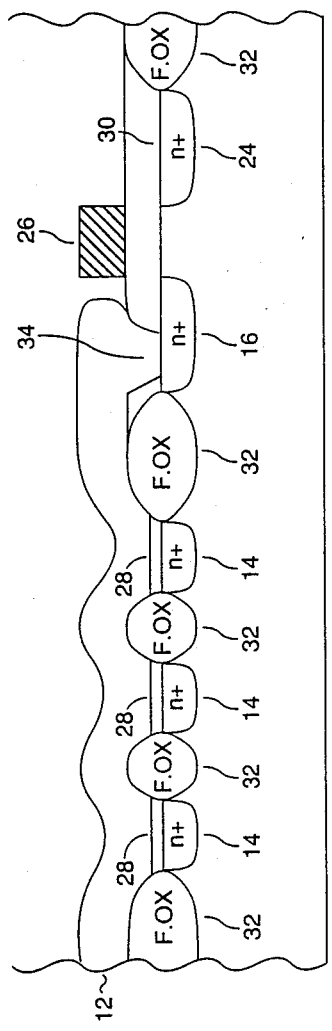
Figure 2A:
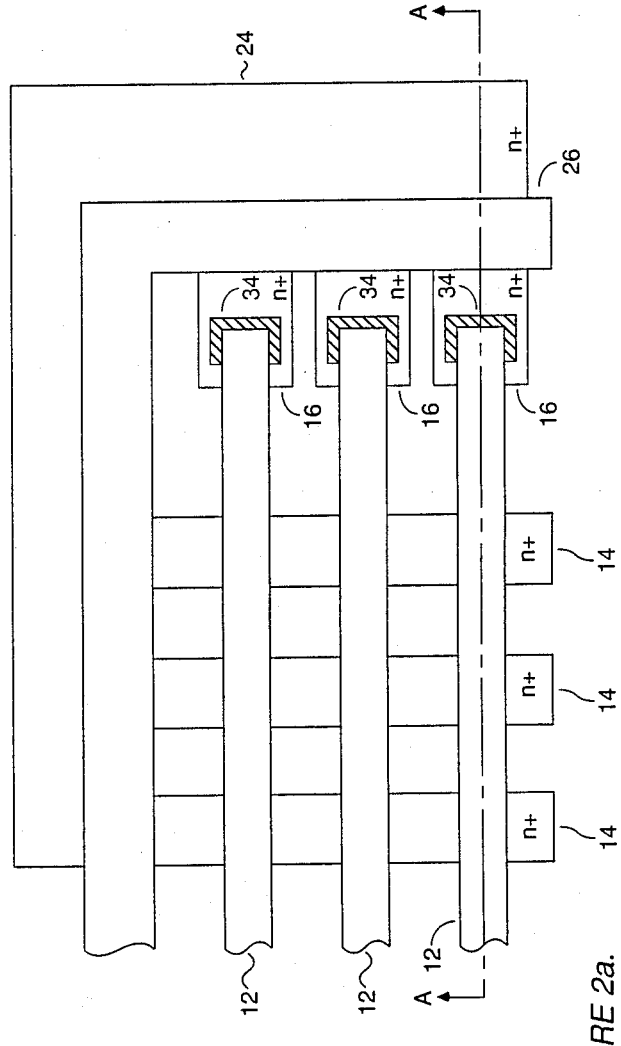
FIG. 2a is a top view of a semiconductor integrated circuit layout showing protection transistors connected via buried contacts to polysilicon strip overlying a fragile dielectric.

In an alternate embodiment of the present invention, provision is made for protection of thin dielectric 28 immediately following the formation of polysilicon layer 12. In this embodiment, shown with respect to FIGS. 2a-b, buried contacts 34 are used to connect polysilicon lines 12 to diffusion region 16. After thin dielectric region 28 and gate oxide region 30 have been formed, apertures for buried contacts are etched through gate oxide layer 30 to diffusion region 16. When polysilicon layer 12 is formed over thin dielectric region 28, the portion of polysilicon region 12 overlying the apertures fills them creating buried contacts 30 in electrical contact with diffusion regions 16.

In the embodiment shown in FIG. 3, the six protection transistors having drains 14 and 16, and common source 24 are configured to be depletion devices. Gate 26 is a floating gate. Methods for fabricating floating gate devices are well known in the art. Since the six protection transistors are depletion transistors, they will remain on until a charge is put on the gate. After completion of the device fabrication the floating gate 26 is charged with electrons via avalanche injection utilizing drain 36 and common source 24. This serves to turn off all six protection transistors. In all other respects, the embodiment of FIG. 3 is much like the embodiment of FIG. 2 wherein polysilicon strips 12 overlie diffusion regions 14, separated therefrom by thin dielectric portions 28. Also, as in the embodiment of FIG. 2, polysilicon strips 12 are connected to drain diffusion regions 16 via buried contact 34, thus assuring protection of the thin dielectric regions 28 at an early point in the process.

As an alternative to the buried contact embodiment shown in FIGS. 2 and 3, an oxide portion of the thin dielectric 28 may be grown over diffusion regions 16 while they are lightly doped. Since the oxide is known to grow at a slower rate over these N diffusions, thin dielectric 28 will be thinnest, and hence weakest, over diffusion region 16. This will assure that if enough charge builds up to cause the dielectric to rupture, the dielectric will rupture in the regions over diffusion regions 16. The polysilicon strip 12 over thin dielectric 28 will thus be allowed to come into contact with diffusion 16 just as if the process step for producing a buried contact had been employed. This embodiment may be realized by simply altering the mask layer which forms drains 16 to allow a portion of thin dielectric region 28 to be grown over the lightly doped N regions.

Those of ordinary skill in the art will recognize that the use of the buried contacts as well as the use of the other techniques herein may be employed in any of the embodiments disclosed herein. The choice to employ a particular method will large be a matter of design choice and be dictated by circuit and processing considerations.

Referring now to FIG. 4, yet another alternate embodiment for protecting fragile dielectric is depicted, wherein polysilicon strip 12 cross over three N+ diffusion strips 14. Those of ordinary skill in the art will understand that underlying polysilicon strip 12 is a thin dielectric 28. Polysilicon strip 12 are discharged through two pathways. The first is N+ diffusions 38. The polysilicon strips 12 are connected to the N+ diffusions 38 via a first set of buried contact 40 in the same manner as the connections are made in FIG. 3. Polysilicon strip 12 continues on past N+ diffusions 38 and is also connected to P+ diffusions 42 via a second set of buried contacts 44. Both P diffusions 43 are located within N well 46.

By the use of the circuit depicted in the embodiment of FIG. 4, N+ diffusions 38 and P well 46 are located in a P-type substrate. The N+ diffusions 38 protect the fragile dielectric 28 from situations where polysilicon strip 12 becomes more positive than do N diffusions 14, by discharging the polysilicon strip 12 through N diffusions 38 into the P substrate. The situations where polysilicon strip 12 is more negative than N+ diffusion regions 14 the charge is taken off of polysilicon strips 12 and transferred to the N well 46 via P+ diffusions 42.

The structures shown in the figures and described in the within specification may all be fabricated using conventional MOS and CMOS fabrication steps. The design and layout of MOS transistors, polysilicon lines, metal lines, contacts, and diffusions are well-known to those of ordinary skill in the art and have not been repeated herein, in order to avoid over complicating the specification and too more clearly point out and define the present invention.

What is claimed is:

1. In an integrated circuit having a dielectric located between a first diffusion region in a substrate and an upper conductor, a structure for protecting said dielectric from damage due to static charge buildup during processing and storage of said circuit, including:
    a second diffusion in said substrate connected to said upper conductor,
    a third diffusion in said substrate spaced apart from said first diffusion and said second diffusion so as to form a first channel in said substrate between said first and third diffusions and to form a second channel in said substrate between said second and third diffusions, said first and second channels doped with depletion implants,
    a floating gate overlying and insulated from both said first and second channels to form first and second depletion mode transistors, and
    means for biasing said floating gate when said integrated circuit is in use such that said first and second channels do not conduct current.

2. In an integrated circuit having a dielectric located between a first diffusion region in a substrate and a first upper conductor, a structure for protecting said dielectric from damage due to static charge buildup during processing and storage of said circuit, including:
    a second diffusion region in said substrate located with respect to said first diffusion so as to create a first channel for a first field effect transistor,
    a dielectric layer above said first channel forming a gate insulator for said first field effect transistor,
    a second upper conductor above said first channel forming a floating gate for said first field effect transistor,
    a third diffusion region in said substrate located with respect to said second diffusion so as to create a second channel for a second field effect transistor, said third diffusion region connected to said first upper conductor by a metal layer contact,
    a dielectric layer above said second channel forming a gate insulator for said second field effect transistor,
    a portion of said second upper conductor lying above said second channel forming a floating gate for said second field effect transistor.

3. In an integrated circuit having a dielectric located between a first diffusion region in a substrate and a first upper conductor, a structure for protecting said dielectric from damage due to static charge buildup during processing and storage of said circuit, including:
    a second diffusion region in said substrate located with respect to said first diffusion so as to create a first channel for a first field effect transistor,
    a dielectric layer above said first channel forming a gate insulator for said first field effect transistor,
    a second upper conductor above said first channel forming a floating gate for said first field effect transistor,
    a third diffusion region in said substrate located with respect to said second diffusion so as to create a second channel for a second field effect transistor, said third diffusion region connected to said first upper conductor by a buried contact,
    a dielectric layer above said second channel forming a gate insulator for said second field effect transistor,
    a portion of said second upper conductor lying above said second channel forming a floating gate for said second field effect transistor.

4. In an integrated circuit having a dielectric located between a first diffusion region in a substrate and a first upper conductor, a structure for protecting said dielectric from damage due to static charge buildup during processing and storage of said circuit, including:
    a second diffusion region in said substrate located with respect to said first diffusion so as to create a first channel for a first field effect transistor,
    a dielectric layer above said first channel forming a gate insulator for said first field effect transistor,
    a second upper conductor above said first channel forming a floating gate for said first field effect transistor,
    a third diffusion region in said substrate located with respect to said second diffusion so as to create a second channel for a second field effect transistor, said third diffusion region connected to said first upper conductor by a buried contact,
    a dielectric layer above said second channel forming a gate insulator for said second field effect transistor,
    a portion of said second upper conductor lying above said second channel forming a floating gate for said second field effect transistor,
    depletion implants in said first and second channels,
    a fourth diffusion region in said substrate so located to allow programming of said floating gate to turn off said first and second field effect transistors.

5. In an integrated circuit having a dielectric located between a first diffusion region of a first conductivity type in a substrate of a second conductivity type and an upper conductor, a structure for protecting said dielectric from damage due to static charge buildup during processing and storage of said circuit, including:
    a second diffusion region of said first conductivity type in said substrate connected to said upper conductor by a buried contact,
    a well of said first conductivity type in said substrate,
    a diffusion of said second conductivity type in said well connected to said upper conductor by a buried contact.

* * * * *